(12) United States Patent
Dando et al.

(10) Patent No.: US 7,114,669 B2
(45) Date of Patent: *Oct. 3, 2006

(54) METHODS OF OPERATING A LIQUID VAPORIZER

(75) Inventors: Ross S. Dando, Nampa, ID (US); Allen P. Mardian, Boise, ID (US); Raynald B. Cantin, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 104 days.

This patent is subject to a terminal disclaimer.

(21) Appl. No.: 10/917,640

(22) Filed: Aug. 13, 2004

(65) Prior Publication Data

US 2005/0011974 A1 Jan. 20, 2005

Related U.S. Application Data

(63) Continuation of application No. 10/340,976, filed on Jan. 13, 2003.

(51) Int. Cl.
B05B 1/30 (2006.01)
B05B 1/24 (2006.01)
C23C 16/00 (2006.01)
F22B 23/06 (2006.01)

(52) U.S. Cl. ............ 239/569; 239/128; 118/715; 122/367.1

(58) Field of Classification Search ............ 239/569, 239/137, 139, 424, 128, 398; 118/715, 726; 122/367.1
See application file for complete search history.

(56) References Cited

U.S. PATENT DOCUMENTS

| | | | |
|---|---|---|---|
| 5,827,481 A | 10/1998 | Bente et al. | 422/81 |
| 5,866,795 A | 2/1999 | Wang et al. | 73/1.36 |
| 5,901,741 A | 5/1999 | Mudd et al. | 137/486 |
| 6,006,701 A | 12/1999 | Nagano | 122/367.1 |
| 6,055,814 A | 5/2000 | Song | 62/3.2 |
| 6,062,246 A | 5/2000 | Tanaka et al. | 137/12 |
| 6,218,504 B1 | 4/2001 | Dolle et al. | 528/483 |
| 6,282,368 B1 | 8/2001 | Horie et al. | 392/394 |
| 6,358,323 B1 | 3/2002 | Schmitt et al. | 118/726 |
| 6,470,144 B1 | 10/2002 | Tarutani et al. | 392/396 |
| 6,527,865 B1 | 3/2003 | Sajoto et al. | 118/715 |
| 2004/0020437 A1 | 2/2004 | Toda et al. | 118/726 |
| 2004/0135271 A1* | 7/2004 | Dando et al. | 261/152 |

FOREIGN PATENT DOCUMENTS

JP 2001262350 A 9/2001

OTHER PUBLICATIONS

Product Information for Diaphram Valve, Polycoat Flochem, Sep. 14, 2001.

* cited by examiner

Primary Examiner—William C. Doerrler
(74) Attorney, Agent, or Firm—Williams, Morgan & Amerson, P.C.

(57) ABSTRACT

The present invention is generally directed to a vaporizer with positive liquid shut-off. In one illustrative embodiment, the vaporizer is comprised of a body, a liquid inlet and a carrier gas inlet coupled to the body, a nozzle positioned within the body, the nozzle having at least one opening formed therethrough that defines a vaporized liquid exit, and a positive shut-off valve, a portion of which is adapted to engage the vaporized liquid exit of the nozzle. In another illustrative embodiment, the vaporizer is comprised of a body, a liquid inlet and a carrier gas inlet coupled to the body and a plurality of peltier cells coupled to the body.

21 Claims, 3 Drawing Sheets

METHODS OF OPERATING A LIQUID VAPORIZER

CROSS-REFERENCE TO RELATED APPLICATION

This is a continuation of application Ser. No. 10/340,976, filed Jan. 13, 2003 now U.S. Pat. No. 6,997,403.

BACKGROUND OF THE INVENTION

1. Field of the Invention

The present invention is generally directed to the field of liquid vaporizers, and, more particularly, to a liquid vaporizer with positive liquid shut-off.

2. Description of the Related Art

In a wafer fabrication process, a wafer is commonly subjected to process gases under pressure in the controlled environment of a process chamber. The depositions formation rate on the wafer and the etching removal rate from the wafer depend on the input gas flow rate of the process gases that enter the process chamber encapsulating the wafer.

A vapor deposition system for wafer fabrication generally includes a liquid delivery or injection system for vaporizing a liquid chemical and carrying the vaporized liquid into the deposition process or reaction chamber for wafer processing. A typical liquid delivery system for a chemical vapor deposition process manages the flow of a liquid precursor or reagent, a carrier gas, and one or more other process gases. The liquid precursor is delivered to a vaporization device at a steady flow rate. The carrier gas is delivered to the vaporization device for mixing with the vaporized liquid precursor. The other process gases are combined with the mixture of the vaporized liquid precursor and carrier gas for delivery to the process chamber.

A critical factor in the production of wafers with superior uniformity is the precise control of the flow rate of the delivery of the liquid precursor into the process chamber. Irregularities in the flow rate may cause non-uniformity and erroneous deposition film thickness that adversely affect wafer quality and acceptability. The liquid precursor flow rate is typically generated by a liquid mass flow controller that is governed electronically by a voltage signal, such as that produced in a liquid flow meter. The accuracy of the flow rate produced by the liquid mass flow controller depends on the calibration between the voltage signal and the actual flow rate delivered.

Many liquid vaporizers tend to trap various amounts of liquid after vaporization processes are stopped. Such trapped liquids must generally be flushed from the system prior to the next use of the liquid vaporizer to introduce liquids into a process chamber. Efforts have been made to reduce the volume of such trapped liquid. Such efforts include, among other things, physically reducing the size of spaces where such liquids may collect.

Liquid vaporizers sometimes use piezoelectric actuators to raise or lower a ball on a valve seat in an effort to stop the flow of a vaporized liquid through the vaporizer and to prevent leakage of liquids resident within the vaporizer after vaporization processes have stopped. However, such arrangements have proven to be unsatisfactory in that the liquid still manages to seep past this sealed surface, thereby resulting in the additional accumulation of fluid that must be flushed prior to using the vaporizer.

The present invention is directed to a method that may solve, or at least reduce, some or all of the aforementioned problems.

SUMMARY OF THE INVENTION

The present invention is generally directed to a vaporizer with positive liquid shut-off. In one illustrative embodiment, the vaporizer is comprised of a body, a liquid inlet and a carrier gas inlet coupled to the body, a nozzle positioned within the body, the nozzle having at least one opening formed therethrough that defines a vaporized liquid exit, and a positive shut-off valve, a portion of which is adapted to engage the vaporized liquid exit of the nozzle. In some embodiments, the positive shut-off valve is a diaphragm or bellows valve, wherein a portion of the diaphragm or bellows is adapted to sealingly engage the vaporized liquid exit of the nozzle.

In another aspect, the present invention is directed to a vaporizer having means for regulating the temperature of the liquid within the vaporizer. In one illustrative embodiment, a vaporizer according to this aspect of the invention is comprised of a body, a liquid inlet and a carrier gas inlet coupled to the body and a plurality of peltier cells coupled to the body. In further embodiments, a temperature sensing device is operatively coupled to the vaporizer to sense the temperature of the liquid within the vaporizer. A controller may use this sensed data to regulate or control the power supplied to the peltier cells to thereby maintain the temperature of the liquid within a desired range.

BRIEF DESCRIPTION OF THE DRAWINGS

The invention may be understood by reference to the following description taken in conjunction with the accompanying drawings, in which like reference numerals identify like elements, and in which.

Figure 1:
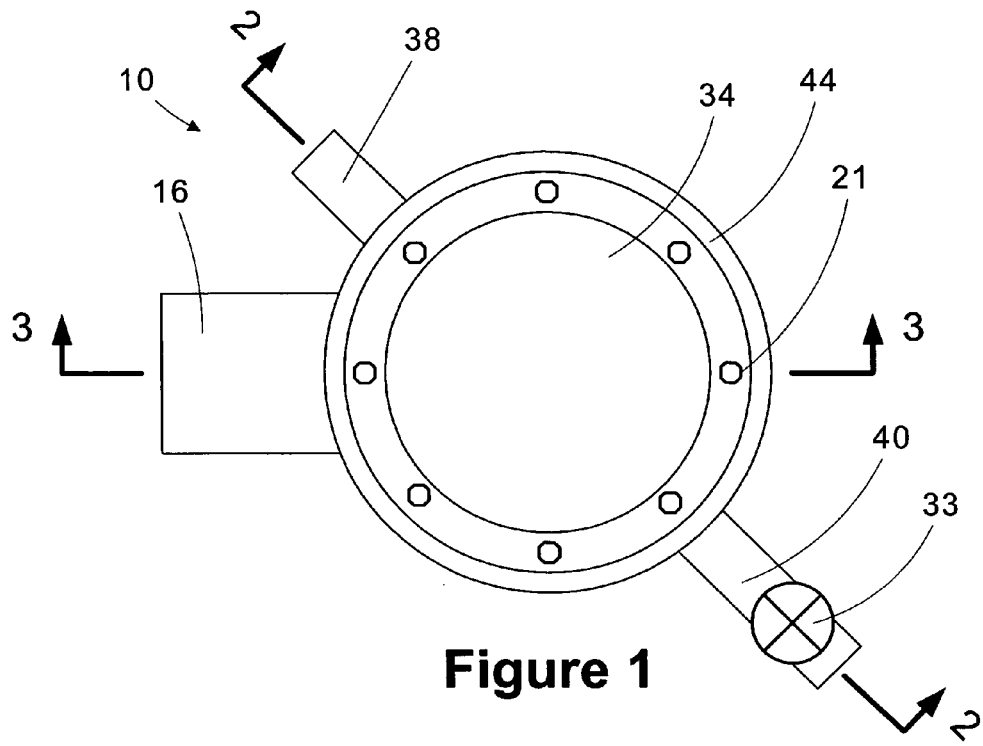
FIG. 1 is a plan view of a vaporizer in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although various regions and structures shown in the drawings are depicted as having very precise, sharp configurations and profiles, those skilled in the art recognize that, in reality, these regions and structures may not be as precise as indicated in the drawings. Additionally, the relative sizes of the various features depicted in the drawings may be exaggerated or reduced as compared to the size of those features in a manufactured device. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
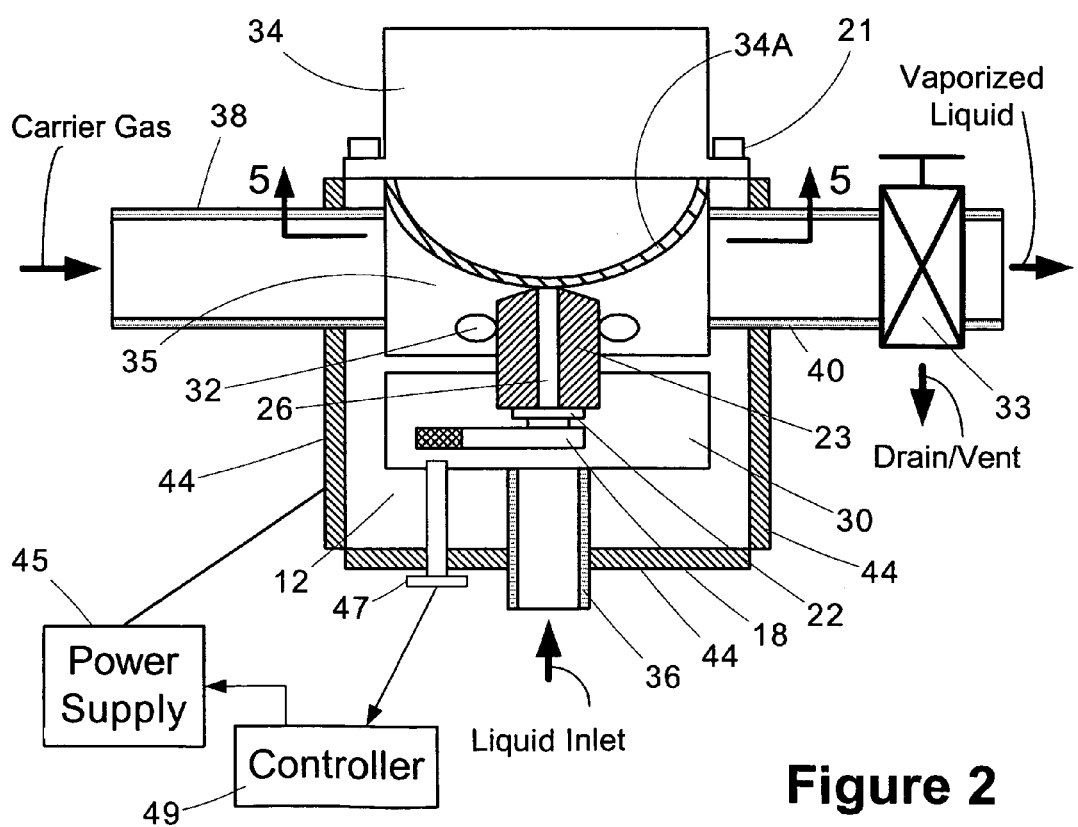
FIG. 2 is a partial, cross-sectional view of the vaporizer depicted in FIG. 1, taken along the line "2—2"

FIGS. 1 and 2 are, respectively, a plan view and a partial cross-sectional view of a vaporizer 10 in accordance with one illustrative embodiment of the present invention. As shown therein, the vaporizer 10 is generally comprised of a body 12, an actuator 16, an actuator arm 18, a seal member 22, a liquid inlet 36, a carrier gas inlet 38, a vaporized liquid outlet 40 and a positive shut-off valve 34. The positive shut-off valve 34 is coupled to the body 12 of the vaporizer 10 by a plurality of fasteners 21. The vaporizer 10 further comprises an actuator cavity 30, a nozzle 23 having an opening 26 formed therethrough that defines a liquid inlet 24 and a vaporized liquid exit 28 (see FIGS. 4A–4B). In some embodiments, a heating element 32 (schematically depicted), e.g., resistance heating rods or elements, may be positioned adjacent the nozzle 23. In an even more specific embodiment, the heating elements 32, when employed, may be positioned adjacent the nozzle 23 near the vaporized liquid exit 28. The vaporizer 10 further comprises a schematically depicted valve 33 that may be used for purposes described more fully herein. In some embodiments, the valve 33 is at least a two-way valve.

In the embodiment depicted in FIG. 2, the positive shut-off valve 34 is a diaphragm valve and the diaphragm 34A is adapted to sealingly engage the vaporized liquid outlet 28 of the nozzle 23. The actuator seal member 22 is adapted to sealingly engage the liquid inlet 24 of the nozzle 23.

Figure 3:
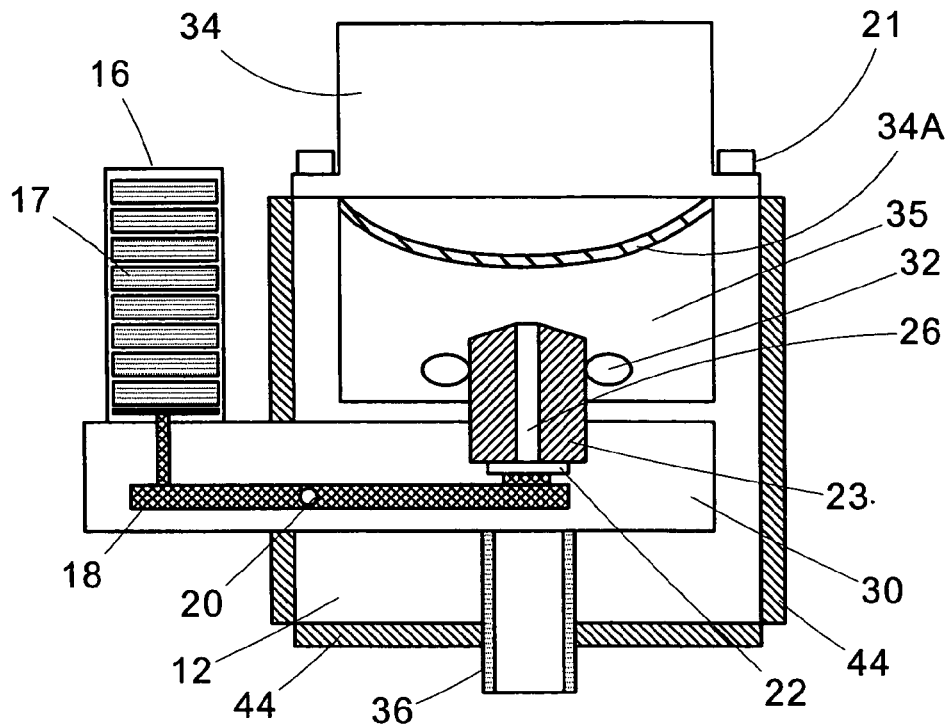
FIG. 3 is another partial, cross-sectional view of the vaporizer depicted in FIG. 1, taken along the line "3—3"

FIG. 3 is a partial, cross-sectional view of the vaporizer 10 depicted in FIG. 1, taken along the line "3—3." The actuator 16, actuator arm 18 and seal member 22 may be any type of mechanism that enables the actuator seal member 22 to establish a seal with the liquid inlet of the nozzle 23. In the depicted embodiment, the actuator arm 18 is adapted to pivot around a pivot pin 20 that is coupled to the body 12. The actuator 16 may be any type of mechanism that may be used to cause movement of the actuator arm 18 to accomplish the purposes described herein. In one illustrative embodiment, the actuator 16 is a stack of piezoelectric members 17 that, when energized, can be used to cause relative movement between the seal member 22 and the liquid inlet 24, e.g., movement from a closed to an open position (or vice versa). However, as will be recognized by those skilled in the relevant art after reading the entirety of the present application, the present invention should not be considered as limited to the use of a piezoelectric type actuator. The actuator cavity 30 is sized and configured such that the actuator arm 18 may move freely within the actuator cavity 30 and to accommodate any process fluids that may flow therethrough. Power may be supplied to piezoelectric members 17 via a conventional power source (not shown). Such piezoelectric actuators are well known to those skilled in the art and will not be described in any further detail so as not to obscure the present invention.

Figure 4A:
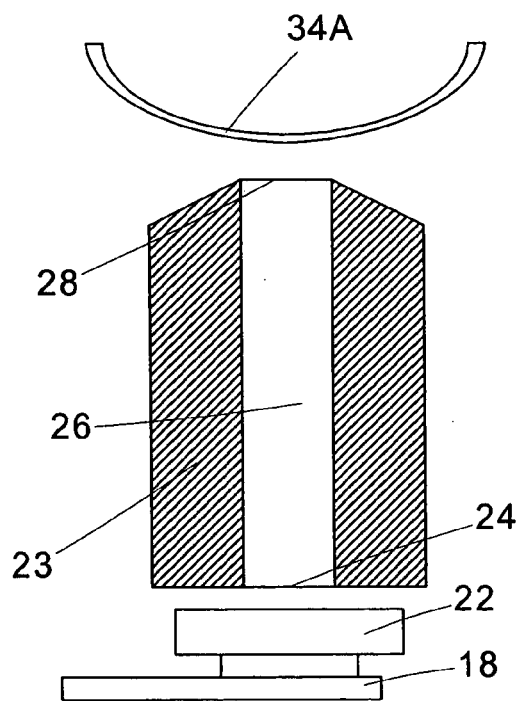
FIGS. 4A–4B are enlarged views of one illustrative embodiment of a nozzle that may be employed with the present invention.
Figure 4B:
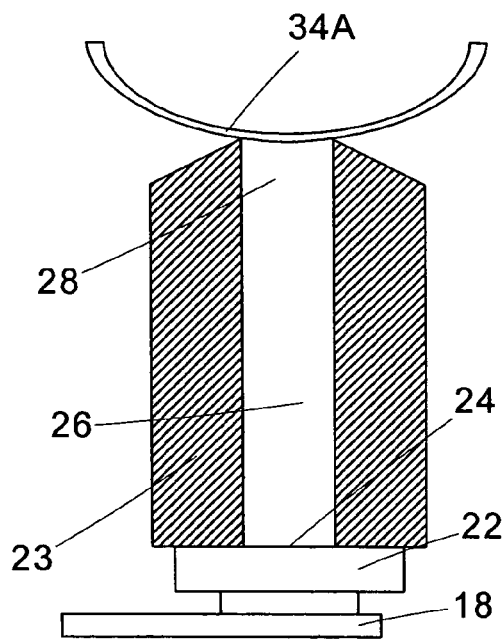

The positive shut-off valve 34 is adapted to, when actuated, provide a positive, liquid-tight seal with the vaporized liquid exit 28 of the nozzle 23. In one illustrative embodiment, the positive shut-off valve 34 may be comprised of a diaphragm valve or a bellows valve. The diaphragm valve and/or the bellows valve may be pneumatic-based devices. The diaphragm or bellows 34A may be comprised of a variety of materials, such as carbide, ruby, or a metal such as stainless steel, hastaloy, inconlnel, etc. In the embodiment depicted in FIG. 2, a portion of the diaphragm 34A is, when actuated, adapted to conform to and sealingly engage the vaporized liquid exit 28. FIGS. 4A–4B are enlarged views of the nozzle 23, the portion 34A of the positive shut-off valve 34, and the seal member 22. Figure 4A depicts the situation in which the portion 34A is not sealingly engaged with the vaporized liquid outlet 28 of the nozzle 23, and the seal member 22 is not sealingly engaged with the liquid inlet 24 of the nozzle 23. FIG. 4B depicts the situation in which both the portion 34A and the seal member 22 are sealingly engaged to the nozzle 23. In FIG. 3, the diaphragm 34A is depicted in the situation where it is disengaged from the vaporized liquid exit 28 of the nozzle 23.

Figure 5:
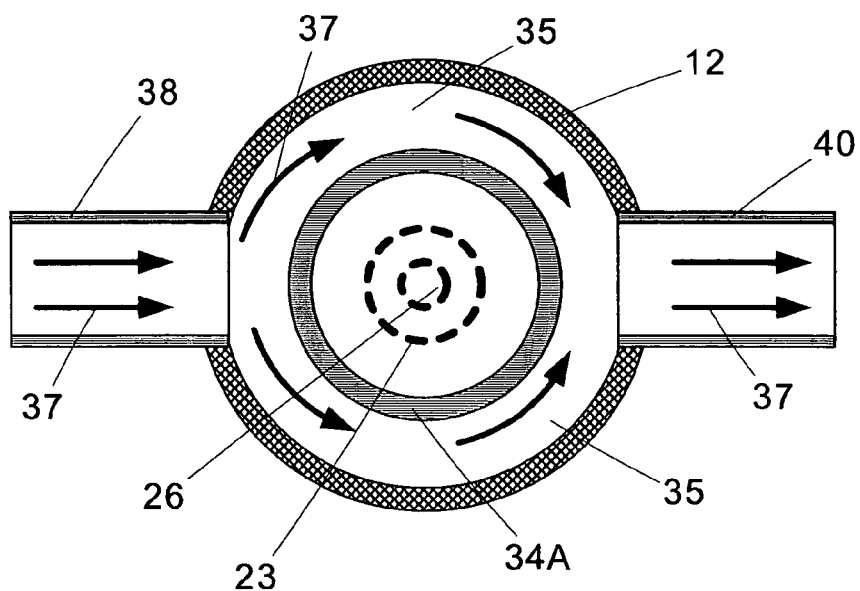
FIG. 5 is a partial, cross-sectional plan view of the vaporizer depicted in FIG. 2, taken along the line "5—5"

FIG. 5 is a partial, cross-sectional plan view of the vaporizer 10 taken along the line "5—5" depicted in FIG. 2. As shown therein, a cavity 35 is formed in the body 12 such that, if desired, carrier gas (as indicated by the arrows 37) may flow around the diaphragm 34A when it is sealingly engaged to the vaporized liquid exit 28 of the nozzle 23.

Figure 6:
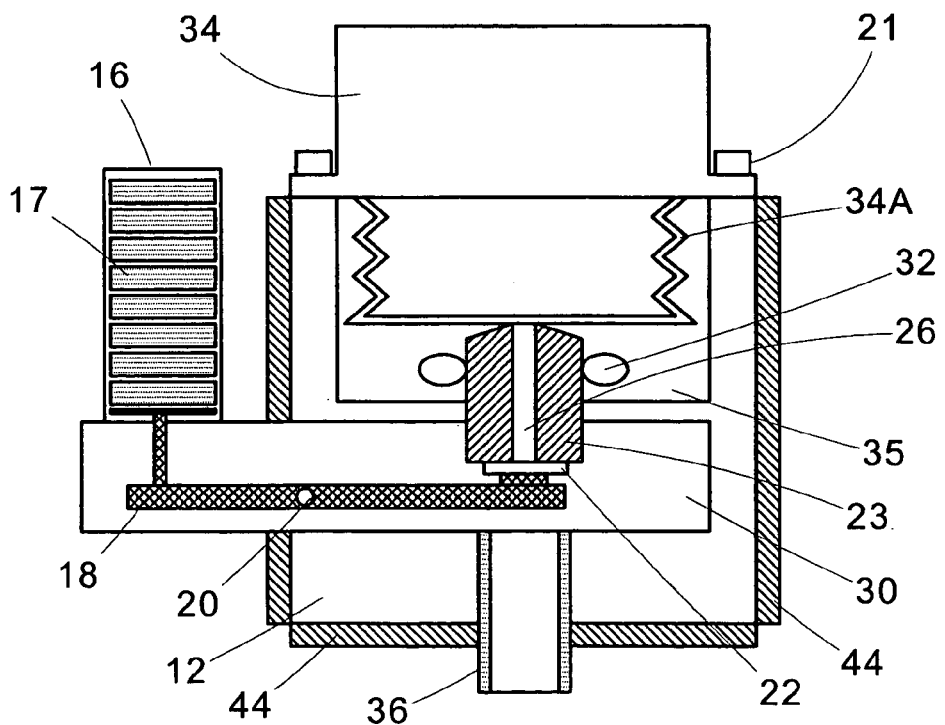
FIG. 6 is a partial, cross-sectional side view of a vaporizer in accordance with another illustrative embodiment of the present invention.

FIG. 6 is a partial, cross-sectional view of an embodiment of the present invention wherein the positive shut-off valve 34 is a bellows valve. As shown therein, a portion of the bellows valve 34A is adapted to sealingly engage the vaporized liquid exit 28.

The valve body 12 may be of any size or configuration, e.g., it may have a generally cylindrical shaped body 12, or a generally rectangular shaped body 12. The valve body 12 may be comprised of a variety of materials, such as metal like stainless steel, hastaloy, inconlnel, etc. Thus, the particular configuration of the body 12 and its materials of construction should not be considered a limitation of the present invention. The overall size of the vaporizer 10 may also vary depending upon the application. For example, in the case of a generally cylindrical shaped device, the overall diameter of the body 12 may be on the order of approximately two inches.

The nozzle 23 may be comprised of a variety of materials, such as stainless steel, hastaloy, inconlnel, etc. The size and configuration of the opening 26 may also vary depending upon the particular application. In one embodiment, the opening 26 may have a diameter of approximately 0.005–0.050 inches and, in one particular embodiment, the diameter may be approximately 0.010 inches. The actuator seal member 22 may be comprised of a variety of materials, such as stainless steel, hastaloy, inconlel, etc. The size, number and configuration of the heating elements 32, if used, may vary depending on the particular application. Such heating elements 32 may be employed in situations where it is desired to heat the liquid to reduce the viscosity of the liquid so that it may readily flow through the opening 26 in the nozzle 23. The heating elements 32 may also be employed in situations where it is desirable to superheat the liquid to some degree.

Also depicted in FIGS. 1 and 2 is another embodiment of the present invention wherein means for cooling the body 12 are provided. In one embodiment, a plurality of peltier cells 44 may be coupled to the body 12. The size, shape and number of the peltier cells 44 may vary depending upon the particular application and the location where cooling is desired. The peltier cells 44 may be coupled to the valve body 12 in a variety of ways as long as the peltier cells 44 can still perform their intended function. In one illustrative embodiment, the peltier cells 44 may be coupled to the valve body 12 by mechanical fasteners. The peltier cells 44 may be coupled to an illustrative power supply 45 and energized as desired to achieve the desired cooling effect. In the embodiment where the peltier cells 44 are employed, a temperature sensing device 47, such as a thermocouple, may be operatively positioned so as to sense the temperature of liquid within the cavity 30 in the body 12. In turn, the sensed temperature may be provided to a controller 49 which regulates or controls the power supplied to the peltier cells 44 such that the liquid within the cavity 30 is maintained within desired limits. In that manner, the peltier cells 44 may be employed to keep the vaporizer 10 at a relatively cool temperature, e.g., approximately 30° C. Such cooling may act to keep the material in a liquid state and to prevent the material from breaking down.

One aspect of the present invention is generally directed to providing a liquid vaporizer 10 with a positive liquid shut-off mechanism. An illustrative operational sequence for such a device will now be described. Initially, with the member 34A sealingly engaged to the vaporized liquid exit 28 of the nozzle 23, a purging process is performed by passing a carrier gas, e.g., an inert gas, helium, argon, nitrogen, etc., through the carrier gas inlet 38 and out the drain/vent. After purging operations are completed, a liquid is introduced into the vaporizer 10 via liquid inlet 36. Alternatively, liquid may still be present in the cavity 30 from previous use of the vaporizer 10. In some embodiments, the carrier gas may flow at a rate of approximately 100–20,000 sccm.

At that time, the member 34A of the positive shut-off valve 34 is disengaged from the vaporized liquid exit 28 of the nozzle 23. The actuator 16 is then activated to cause the seal member 22 to move relative to the liquid inlet 24 of the nozzle 23. The pressure within the cavity 30 is generally higher relative to the pressure at the vaporized liquid exit 28 of the nozzle 23. This pressure differential may be created by establishing vacuum conditions in the cavity 35 or by supplying positive pressure within the actuator cavity 30.

The actuator 16 and actuator arm 18 are sized and configured such that the seal member 22 allows very small droplets of liquid to pass through the opening 26. This may be accomplished by breaking at least a portion of the seal between the seal member 22 and the liquid inlet 24 very frequently. For example, the actuator 16 and actuator arm 18 may be configured such that the seal member 22 breaks the seal with the liquid inlet 24 every 10 milliseconds. These pulses of very small liquid droplets then exit the nozzle 23 as vaporized liquid via the vaporized liquid exit 28. The carrier gas flowing through the vaporizer 10 may then transport the vaporized liquid to the downstream process tool via the vaporized liquid outlet 40. If desired, the valve 33 may be positioned to direct flow therethrough to the drain/vent when vaporizing processes are being started. It can be maintained in that position until such time as the appropriate process engineer is confident that the vaporizer 10 is producing the desired stream of vaporized liquid. At that time, the valve 33 may then be positioned such that the vaporized liquid is directed to the downstream process tool.

To stop operation of the vaporizer 10, the following steps may be taken. Initially, the seal member 22 is sealingly engaged with the liquid inlet 24 of the nozzle 23. Depending upon whether the system is designed as a normally-closed or normally-open system, the actuator 16 may or may not be actuated. Thereafter, the member 34A of the positive shut-off valve 34 may be actuated so as to sealingly engage the vaporized liquid exit 28 of the nozzle 23. This may be accomplished by supplying the appropriate fluid, e.g., air pressure, to the positive shut-off valve 34. Then, carrier gas may be passed through the vaporizer 10 and out the drain/vent to flush out the vaporizer 10 of any remnants of the vaporization process.

In one aspect, the present invention is generally directed to a vaporizer with positive liquid shut-off. In one illustrative embodiment, the vaporizer is comprised of a body, a liquid inlet and a carrier gas inlet coupled to the body, a nozzle positioned within the body, the nozzle having at least one opening formed therethrough that defines a vaporized liquid exit, and a positive shut-off valve, a portion of which is adapted to engage the vaporized liquid exit of the nozzle. In some embodiments, the positive shut-off valve is a diaphragm or bellows valve, wherein a portion of the diaphragm or bellows is adapted to sealingly engage the vaporized liquid exit 28 of the nozzle 23.

In another aspect, the present invention is directed to a vaporizer having means for regulating the temperature of the liquid within the vaporizer. In one illustrative embodiment, a vaporizer according to this aspect of the invention is comprised of a body, a liquid inlet and a carrier gas inlet coupled to the body and a plurality of peltier cells coupled to the body. In further embodiments, a temperature sensing device is operatively coupled to the vaporizer to sense the temperature of the liquid within the vaporizer. A controller may use this sensed data to regulate or control the power supplied to the peltier cells 44 to thereby maintain the temperature of the liquid within a desired range.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

The invention claimed is:

1. A method, comprising:

introducing a liquid to be vaporized into a vaporizer, said vaporizer comprising a nozzle having a vaporized liquid exit and a liquid inlet;

actuating a seal member that is adapted to sealingly engage said liquid inlet of said nozzle to regulate a flow of said liquid into said nozzle; and actuating a positive shut-off valve that is adapted to sealingly engage said vaporized liquid exit of said nozzle.

2. The method of claim 1, wherein said vaporizer further comprises an actuator arm that is operatively coupled to said seal member, wherein the method further comprises actuating said actuator arm to move said seal member relative to said liquid inlet of said nozzle.

3. The method of claim 1, wherein said vaporizer further comprises an actuator arm that is operatively coupled to said seal member, wherein the method further comprises actuating said actuator arm to actuate said seal member from a first position wherein said seal member is sealingly engaged with said liquid inlet of said nozzle to a second position where said seal member is not sealingly engaged with said liquid inlet of said nozzle.

4. The method of claim 1, wherein said positive shut-off valve is a diaphragm valve, and actuating said positive shut-off valve comprises actuating said diaphragm valve such that a portion of said diaphragm sealingly engages said vaporized liquid exit of said nozzle.

5. The method of claim 1, wherein said positive shut-off valve is a bellows valve, and actuating said positive shut-off valve comprises actuating said bellows valve such that a portion of said bellows sealingly engages said vaporized liquid exit of said nozzle.

6. The method of claim 2, wherein said actuator arm is operatively coupled to an actuator comprised of a stack of piezoelectric materials, and wherein actuating said actuator arm comprises energizing said stack of piezoelectric materials to actuate said actuator arm.

7. The method of claim 1, wherein said vaporizer comprises a body having a first cavity and a second cavity formed therein, and wherein said liquid inlet of said nozzle is positioned within said first cavity and said vaporized liquid exit of said nozzle is positioned in said second cavity, wherein actuating said seal member comprises actuating said seal member to regulate a flow of liquid in said first cavity into said nozzle.

8. The method of claim 1, wherein said vaporizer comprises a body having a first cavity and a second cavity formed therein, and wherein said liquid inlet of said nozzle is positioned within said first cavity and said vaporized liquid exit of said nozzle is positioned in said second cavity, wherein actuating said positive shut-off valve comprises actuating said positive shut-off valve to regulate a flow of vaporized liquid from said vaporized liquid exit of said nozzle into said second cavity.

9. A method, comprising:
introducing a liquid to be vaporized into a vaporizer, said vaporizer comprising:
a nozzle having a vaporized liquid exit and a liquid inlet;
a seal member that is adapted to sealingly engage said liquid inlet of said nozzle; and
an actuator arm that is operatively coupled to said seal member;

actuating said actuator arm to move said seal member relative to said liquid inlet of said nozzle; and actuating a positive shut-off valve that is adapted to sealingly engage said vaporized liquid exit of said nozzle.

10. The method of claim 9, wherein actuating said actuator arm to move said seal member relative to said liquid inlet of said nozzle comprises actuating said actuator arm to move said seal member from a first position wherein said seal member is sealingly engaged with said liquid inlet of said nozzle to a second position where said seal member is not sealingly engaged with said liquid inlet of said nozzle.

11. The method of claim 9, wherein said positive shut-off valve is a diaphragm valve, and actuating said positive shut-off valve comprises actuating said diaphragm valve such that a portion of said diaphragm sealingly engages said vaporized liquid exit of said nozzle.

12. The method of claim 9, wherein said positive shut-off valve is a bellows valve, and actuating said positive shut-off valve comprises actuating said bellows valve such that a portion of said bellows sealingly engages said vaporized liquid exit of said nozzle.

13. The method of claim 9, wherein said actuator arm is operatively coupled to an actuator comprised of a stack of piezoelectric materials, and wherein actuating said actuator arm comprises energizing said stack of piezoelectric materials to actuate said actuator arm.

14. The method of claim 9, wherein said vaporizer comprises a body having a first cavity and a second cavity formed therein, and wherein said liquid inlet of said nozzle is positioned within said first cavity and said vaporized liquid exit of said nozzle is positioned in said second cavity, wherein actuating said actuator arm to move said seal member comprises actuating said actuator arm to move said seal member to regulate a flow of liquid in said first cavity into said nozzle.

15. The method of claim 9, wherein said vaporizer comprises a body having a first cavity and a second cavity formed therein, and wherein said liquid inlet of said nozzle is positioned within said first cavity and said vaporized liquid exit of said nozzle is positioned in said second cavity, wherein actuating said positive shut-off valve comprises actuating said positive shut-off valve to regulate a flow of vaporized liquid from said vaporized liquid exit of said nozzle into said second cavity.

16. A method of operating a vaporizer comprising a body, a first cavity and a second cavity formed in said body, and a nozzle having a liquid inlet and a vaporized liquid exit, said liquid inlet of said nozzle being positioned within said first cavity and said vaporized liquid exit of said nozzle being positioned within said second cavity, wherein the method comprises:
introducing a liquid to be vaporized by said vaporizer into said first cavity;
actuating a seal member that is adapted to sealingly engage said liquid inlet of said nozzle to regulate a flow of liquid in said first cavity into said nozzle; and
actuating a positive shut-off valve that is adapted to sealingly engage said vaporized liquid exit of said nozzle to regulate a flow of liquid from said vaporized liquid exit of said nozzle into said second cavity.

17. The method of claim 16, wherein said vaporizer further comprises an actuator arm that is operatively coupled to said seal member, wherein the method further comprises actuating said actuator arm to move said seal member relative to said liquid inlet of said nozzle.

18. The method of claim 16, wherein said vaporizer further comprises an actuator arm that is operatively coupled to said seal member, wherein the method further comprises actuating said actuator arm to actuate said seal member from a first position wherein said seal member is sealingly engaged with said liquid inlet of said nozzle to a second position where said seal member is not sealingly engaged with said liquid inlet of said nozzle.

19. The method of claim 16, wherein said positive shut-off valve is a diaphragm valve, and actuating said positive shut-off valve comprises actuating said diaphragm valve such that a portion of said diaphragm sealingly engages said vaporized liquid exit of said nozzle.

20. The method of claim 16, wherein said positive shut-off valve is a bellows valve, and actuating said positive shut-off valve comprises actuating said bellows valve such that a portion of said bellows sealingly engages said vaporized liquid exit of said nozzle.

21. The method of claim 17, wherein said actuator arm is operatively coupled to an actuator comprised of a stack of piezoelectric materials, and wherein actuating said actuator arm comprises energizing said stack of piezoelectric materials to actuate said actuator arm.

* * * * *